United States Patent
Xi et al.

(10) Patent No.: US 10,134,771 B2
(45) Date of Patent: Nov. 20, 2018

(54) ARRAY SUBSTRATE, METHOD OF PRODUCING ARRAY SUBSTRATE, AND DISPLAY PANEL

(71) Applicants: Boe Technology Group Co., Ltd., Beijing (CN); Beijing Boe Display Technology Co., Ltd., Beijing (CN)

(72) Inventors: Yusheng Xi, Beijing (CN); Haichen Hu, Beijing (CN); Ming Tian, Beijing (CN)

(73) Assignees: BOE TECHNOLOGY GROUP CO., LTD., Beijing (CN); BEIJING, BOE DISPLAY TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/276,221

(22) Filed: Sep. 26, 2016

(65) Prior Publication Data

US 2017/0010511 A1 Jan. 12, 2017

Related U.S. Application Data

(63) Continuation-in-part of application No. 14/500,402, filed on Sep. 29, 2014, now abandoned.

(30) Foreign Application Priority Data

Jun. 19, 2014 (CN) .......................... 2014 1 0276679

(51) Int. Cl.
*H01L 27/12* (2006.01)
*G02F 1/1339* (2006.01)
(Continued)

(52) U.S. Cl.
CPC .......... *H01L 27/124* (2013.01); *G02F 1/1368* (2013.01); *G02F 1/13394* (2013.01);
(Continued)

(58) Field of Classification Search
None
See application file for complete search history.

(56) References Cited

U.S. PATENT DOCUMENTS

2008/0123007 A1* 5/2008 Cui ..................... G02F 1/13394
349/43
2011/0073862 A1 3/2011 Chen
(Continued)

OTHER PUBLICATIONS

Office action from Chinese Application No. 201410276679.7 dated May 5, 2016.
(Continued)

*Primary Examiner* — Whitney T Moore
(74) *Attorney, Agent, or Firm* — Calfee, Halter & Griswold LLP

(57) ABSTRACT

An array substrate, a method of producing the array substrate, and a display panel incorporating the array substrate are disclosed. The array substrate includes a substrate, a gate line, a data line, and a spacer. The gate line and the data line are arranged over the substrate. The spacer is arranged over the gate line and the data line. The gate line and/or the data line is provided with a via hole at a position corresponding to a spacer. In this manner, a problem of a display panel having gaps of different sizes after assembly because of non-uniform thicknesses of the gate line and/or the data line can be avoided, which, in turn, prevents inhomogeneous color in the display.

17 Claims, 6 Drawing Sheets

(51) Int. Cl.
*H01L 29/786* (2006.01)
*G02F 1/1335* (2006.01)
*G02F 1/1368* (2006.01)
*G02F 1/1362* (2006.01)

(52) U.S. Cl.
CPC .. *G02F 1/133514* (2013.01); *G02F 1/136227* (2013.01); *G02F 1/136286* (2013.01); *H01L 27/1248* (2013.01); *H01L 27/1259* (2013.01); *G02F 2001/136295* (2013.01); *H01L 29/7869* (2013.01)

(56) References Cited

U.S. PATENT DOCUMENTS

| | | |
|---|---|---|
| 2011/0149186 A1 | 6/2011 | Song et al. |
| 2012/0133873 A1 | 5/2012 | Park |
| 2012/0184060 A1 | 7/2012 | Song et al. |
| 2012/0188478 A1 | 7/2012 | Kuwabara |
| 2015/0325591 A1* | 11/2015 | Guo .............. H01L 27/124 257/72 |
| 2015/0372012 A1 | 12/2015 | Xi et al. |

OTHER PUBLICATIONS

Office action from U.S. Appl. No. 14/500,402 dated May 19, 2015.
Office action from U.S. Appl. No. 14/500,402 dated Sep. 4, 2015.
Advisory Action from U.S. Appl. No. 14/500,402 dated Nov. 18, 2015.
Office action from U.S. Appl. No. 14/500,402 dated Jan. 21, 2016.
Office action from U.S. Appl. No. 14/500,402 dated May 26, 2016.
Advisory action from U.S. Appl. No. 14/500,402 dated Aug. 4, 2016.
Office Action from China Application No. 201410276679.7 dated Oct. 17, 2016.
Office Action from China Application No. 201410276679.7 dated Feb. 15, 2017.

\* cited by examiner

ARRAY SUBSTRATE, METHOD OF PRODUCING ARRAY SUBSTRATE, AND DISPLAY PANEL

RELATED APPLICATIONS

The present application is a continuation-in-part of application Ser. No. 14/500,402, filed Sep. 29, 2014, which claims the benefit of Chinese Patent Application No. 201410276679.7, filed Jun. 19, 2014, the entire disclosure of which is incorporated herein by reference.

FIELD

The present invention relates to the field of display technology, and particularly to an array substrate, a method of producing the array substrate, and a display panel incorporating the array substrate.

BACKGROUND

During the production of a conventional Thin Film Transistor Liquid Crystal Display (TFT-LCD) panel, gate lines and data lines are usually formed using a sputtering device. Inherent deficiencies in the structure of the sputtering device lead to the problem of non-uniform film thicknesses of the gate lines and the data lines formed by said sputtering device.

It is typically required to form a spacer between an array substrate and a color-film substrate during formation of the TFT-LCD panel. The spacer is made at a corresponding position in the gate line and/or the data line on the array substrate. Since the thicknesses of the gate line and the data line are non-uniform, and the spacer plays the role of supporting the whole substrate, gaps between the array substrate and the color-film substrate have different sizes after cell assembly of the two substrates, which gives rise to the problem of inhomogeneous color in the formed display so that said panel does not function properly. This leads to a waste of the production material and an increase in the product cost.

Accordingly, there is an unmet need to solve these problems associated with production of TFT-LCD panels.

SUMMARY

An array substrate is provided in accordance with a first exemplary aspect of the present disclosure. The array substrate comprises a substrate, a gate line, a data line arranged over the substrate, and a spacer arranged over the gate line and the data line. The gate line and/or the data line of the array substrate is provided with a via hole at a position corresponding to the spacer.

With the array substrate of the present disclosure, it is possible to avoid the problem of display panels that have gaps of different sizes after cell assembly because of non-uniform thicknesses of the gate line and/or the data line at a position on the array substrate corresponding to the spacer, thereby avoiding inhomogeneous color in the display and preventing increased production costs.

In an exemplary aspect of the present disclosure, the array substrate further comprises a gate insulating layer between the gate line and the spacer, wherein the gate insulating layer is provided with a via hole at a position corresponding to the spacer.

In an exemplary aspect of the present disclosure, the array substrate further comprises a passivation layer between the data line and the spacer, wherein the passivation layer is provided with a via hole at a position corresponding to the spacer.

In an exemplary aspect of the present disclosure, the array substrate further comprises a gate insulating layer, an active layer, a passivation layer, and an ITO pixel electrode layer, wherein the gate insulating layer, the active layer, the passivation layer, and the ITO pixel electrode layer are each disposed between the gate line and the spacer.

In an exemplary aspect of the present disclosure, the array substrate further comprises a passivation layer and an ITO pixel electrode layer, wherein the passivation layer and the ITO pixel electrode layer are each disposed between the data line and the spacer.

In an exemplary aspect of the present disclosure, the array substrate further comprises a first ITO pixel electrode layer, a gate insulating layer, an active layer, a passivation layer, and a second ITO pixel electrode layer, wherein the first ITO pixel electrode layer, the gate insulating layer, the active layer, the passivation layer, and the second ITO pixel electrode layer between the gate line and the spacer.

A method of producing an array substrate is provided in accordance with a second exemplary aspect of the present disclosure. The method comprises forming a gate line and a data line over a substrate; forming a spacer over the gate line and the data line; and forming, in the gate line and/or the data line, a via hole at a position corresponding to the spacer.

In an exemplary aspect of the present disclosure, forming a gate line over the substrate comprises forming a gate metal layer over the substrate using a patterning process to form a pattern of the gate line.

In an exemplary aspect of the present disclosure, forming a via hole at a position corresponding to the spacer comprises forming a gate insulating layer on the gate line and forming a via hole penetrating the gate line and the gate insulating layer at a position corresponding to the spacer.

In an exemplary aspect of the present disclosure, forming the data line over the substrate comprises forming a source or a drain metal layer on the gate insulating layer using a patterning process to form a pattern of the data line.

In an exemplary aspect of the present disclosure, the method further comprises forming a passivation layer on the data line and forming a via hole in the passivation layer at a position corresponding to the spacer.

A display panel is provided in accordance with a third exemplary aspect of the present disclosure. The display panel comprises the array substrate described above and an opposite substrate. The spacer, described above, is arranged between the array substrate and the opposite substrate to as to define a gap between the array substrate and the opposite substrate. In an exemplary aspect of the present disclosure, the display panel is an LCD display panel and the opposite substrate is a color film substrate.

With the array substrate, the method of producing the same, and the display panel incorporating the same, as provided in the respective examples of the present disclosure, by setting a via hole in the gate line and/or the data line on the array substrate at a position corresponding to the spacer, the gate line and/or the data line on the array substrate to which the spacer position corresponds are removed, thereby solving the problem in conventional display panels involving gaps that have different sizes after cell assembly of the display panels because of non-uniform thicknesses of the gate line and/or the data line on the array substrate to which the spacer corresponds. As a result, the display panels do not exhibit inhomogeneous color in their display.

BRIEF DESCRIPTION OF THE DRAWINGS

Several technical aspects of the present disclosure will be described in more detail below with reference to the accompanying drawings in order for those skilled in the art to be able to carry out the present disclosure. The present disclosure may, however, be embodied in many different forms and should not be construed as limited to the exemplary embodiments set forth herein. In particular, the general inventive concepts are not intended to be limited by the various illustrative embodiments disclosed herein.

Figure 1:
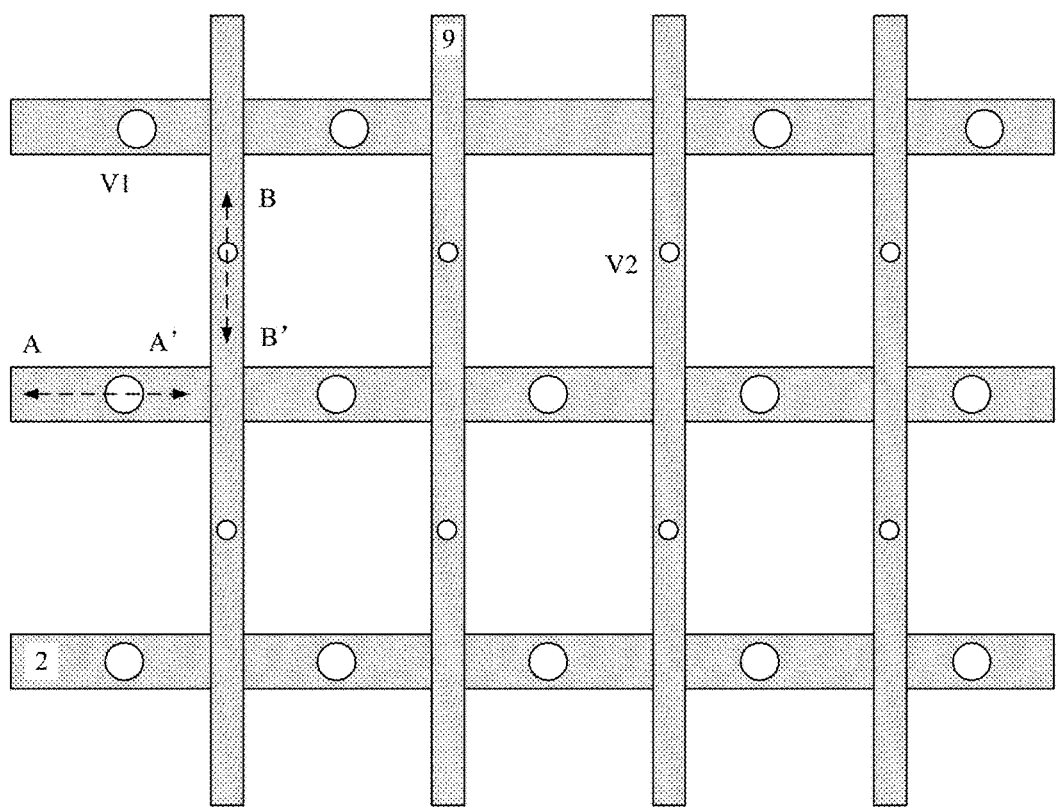
FIG. 1 is a top view structural diagram of an array substrate, according to an exemplary embodiment.

The reference numerals presented in the drawings are explained as follow: 1—substrate; 2—gate line; 3—gate insulating layer; 4—passivation layer; 5—active layer; 6—second ITO pixel electrode layer; 7—first ITO pixel electrode layer, 8—spacer, and 9—data line.

DETAILED DESCRIPTION

The present invention and associated general inventive concepts will be further described hereinafter in detail with reference to the accompanying drawings and various exemplary embodiments. One of ordinary skill in the art will appreciate that these exemplary embodiments only constitute some of the possible embodiments encompassed by the present invention and associated general inventive concepts. As such, the scope of the present disclosure is by no means limited to the exemplary embodiments set forth herein.

The "spacer," as used and described herein, is a component arranged between an array substrate and an opposite substrate of a display device, which exists in the final display device so as to define the gap between the array substrate and the opposite substrate and support the both. In some embodiments, the spacer has a shape of a cylinder or sphere. A display device may have a plurality of spacers, each formed in a region between pixels and having a width smaller than a half of that of a gate line or data line. The spacer is generally formed at a corresponding position in the gate line and/or data line on the array substrate. Since the thicknesses of the gate line and data line are non-uniform, and the spacer plays the role of supporting the whole substrate, the spacer may cause that gaps between the array substrate and the color-film substrate have different sizes after cell assembly of the two substrates. The gaps may cause inhomogeneous color in the formed display so that said display is not available. This leads to waste of the production material and increase in the product cost.

The "via hole," as used and described herein, refers to a through hole penetrating the gate line and/or the data line of an array substrate, of which size is greater than or equal to the projection of a spacer on the substrate and of which diameter is smaller than the width of the gate line or the data line. Accordingly, the gate line and/or data line on the array substrate to which the spacer position corresponds are removed, thereby solving the problem in the existing display panel that that gaps have different sizes after cell assembly of display panels because of non-uniform thicknesses of the gate line and/or data line on the array substrate to which the spacer corresponds is solved, and avoiding inhomogeneous color in the display. In addition, although provided with a via hole, the gate line and/or the data line is still capable of transmitting corresponding signals, since the gate line and/or the data line is not completely interrupted by the via hole.

Figure 2:
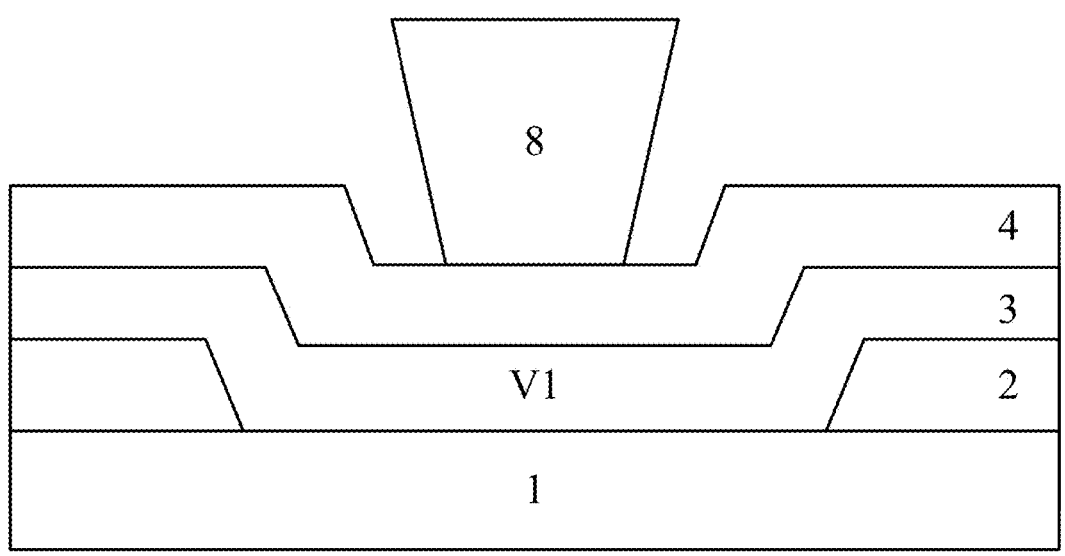
FIG. 2 is a cross-sectional view of the array substrate of FIG. 1 along the line A-A'.
Figure 3:
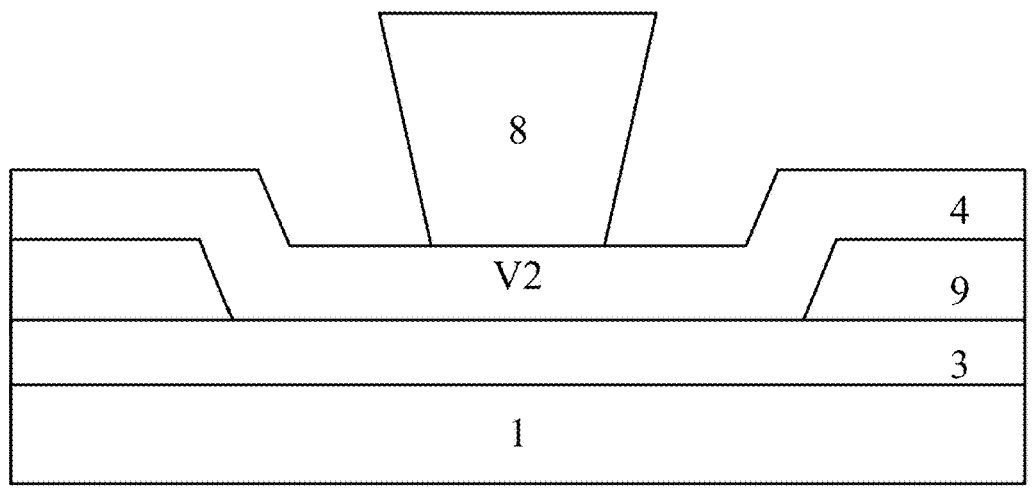
FIG. 3 is a cross-sectional view of the array substrate of FIG. 1 along the line B-B'.

FIG. 1 schematically illustrates a top view of an array substrate according to an exemplary embodiment. The array substrate shown in FIG. 1 includes an array of gate lines 2 including via holes V1, and data lines 9 including via holes V2. FIGS. 2 and 3 illustrate cross-section views of the array substrate of FIG. 1 along the line A-A' and the line B-B', respectively.

As shown in FIGS. 1-3, an array substrate, according to an exemplary embodiment, comprises a substrate 1, a gate line 2 and a data line 9 arranged over the substrate 1, and a spacer 8 arranged over the gate line 2 and the data line 9. The gate line 2 and or data line 9 are provided with via holes V1 and V2 at positions corresponding to the spacer 8. It is noted that, although via holes V1 and V2 shown in FIG. 1 are formed in both the gate lines 2 and data lines 9, the via holes V1, V2 may be formed online in the gate lines 2 or only in the data lines 9.

In an exemplary embodiment, as shown in FIG. 2, when the spacer 8 is set at a position corresponding to the gate line 2, the position in the gate line 2 of the array substrate which is corresponding to the spacer 8 is provided with a via hole V1. The via hole V1 at the corresponding position in said gate line 2 may be formed together with the gate line 2 by a patterning process using a mask plate having a certain shape during the formation of the gate line 2.

In an exemplary embodiment, as shown in FIG. 3, when the spacer 8 is set at a position corresponding to the data line 9, the position in the data line 9 of the array substrate which is corresponding to the spacer 8 is provided with a via hole V2. The via hole V2 at the corresponding position in said data line 9 may be formed together with the data line by a patterning process using a mask plate that can form a via hole in the data line 9 during the formation of the data line 9. Any suitable shape of the mask plate can be used, as long as the mask plate can form a data line 9 and form a via hole in the data line at a position corresponding to the spacer.

Figure 4:
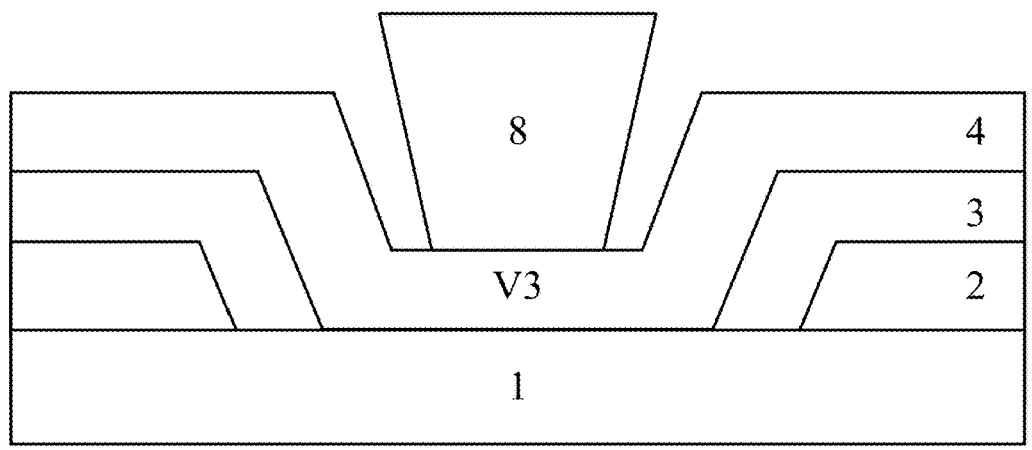
FIG. 4 is a cross-sectional view another array substrate similar to that of FIG. 1 along the line A-A'.

In an exemplary embodiment, as shown in FIG. 4, the array substrate 1 further comprises a gate insulating layer 3 between the gate line 2 and the spacer 8. The gate insulating layer 3 is provided with a via hole V3 at a position corresponding to the spacer 8. The via hole V3 penetrates the gate line 2 and the gate insulating layer 3.

In an exemplary embodiment, the via holes penetrating the gate line 2 and the gate insulating layer 3 may be, respectively, formed by a patterning process using a mask plate during the production of the gate line 2 and/or the gate insulating layer 3. The via holes penetrating the gate line 2 and the gate insulating layer 3 may also be formed by etching, composition, etc. during the formation of the gate insulating layer 3.

Figure 5:
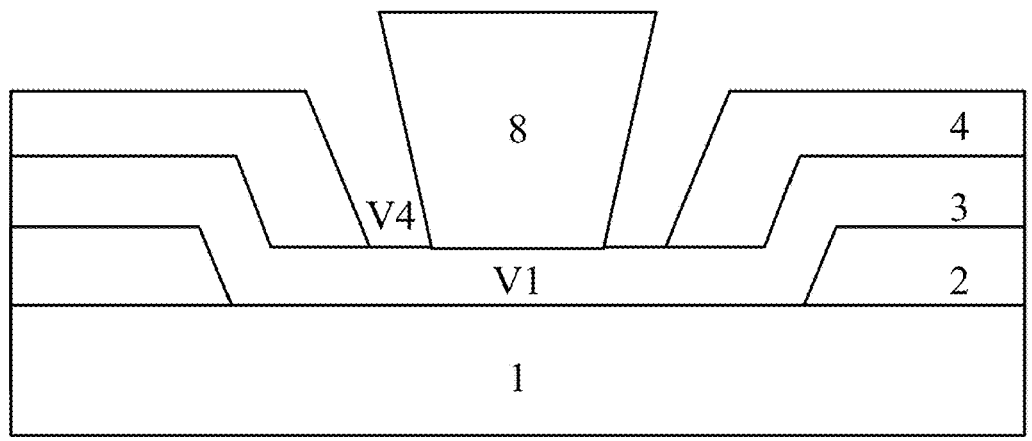
FIG. 5 is a cross-sectional view another array substrate similar to that of FIG. 1 along the line B-B'.

In an exemplary embodiment, as shown in FIG. 5, the array substrate further comprises a passivation layer 4 between the data line 9 and the spacer 8, wherein the passivation layer 4 is provided with a via hole V4 at a position corresponding to the spacer 8.

If the gate insulating layer 3 and the passivation layer 4 are formed by a sputtering process using a sputtering device during production thereof, due to the deficiencies possessed by the sputtering device, and if the array substrate where the spacer is located has the gate insulating layer 3 and the passivation layer 4, there will be the problem of inhomogeneous color in the display because gaps of different sizes after cell assembly will result from non-uniform thicknesses of the gate insulating layer 3 and the passivation layer 4. During formation, however, via holes are provided at the positions in the gate insulating layer 3 and the passivation layer 4 which correspond to the spacer. In this manner, the gate insulating 3 layer and the passivation layer 4 are not present at the positions in the array substrate, which correspond to the spacer. As a result, the problem of non-uniform film thicknesses at spacer locations is avoided, which effectively avoids the related problem of inhomogeneous color in the display.

Figure 6:
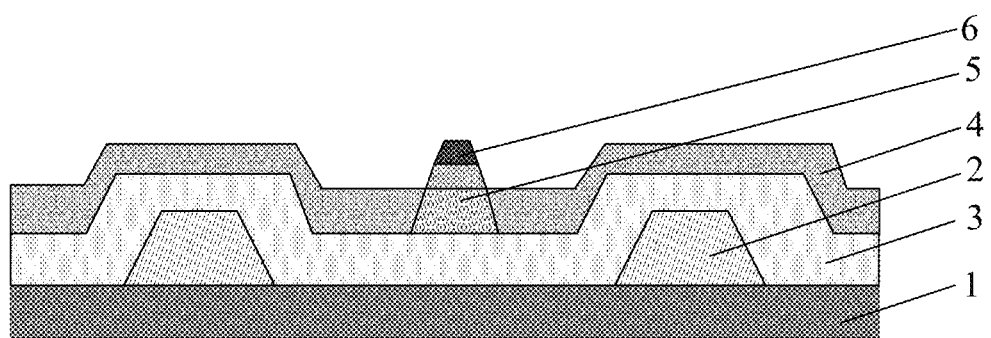
FIG. 6 is a structural diagram of yet another array substrate, according to an exemplary embodiment.

As shown in FIG. 6, the array substrate may further comprise a source electrode, a drain electrode, and an Indium Tin Oxide (ITO) pixel electrode layer 6, wherein the source electrode and the drain electrode are not shown in FIG. 6.

Figure 7:
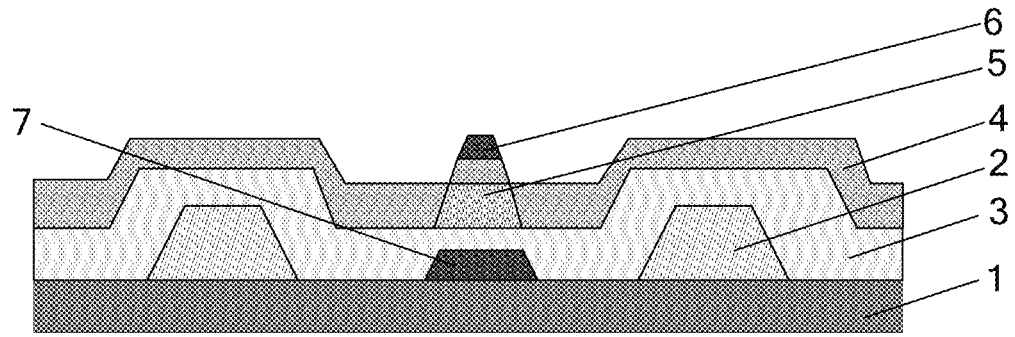
FIG. 7 is a structural diagram of still another array substrate, according to an exemplary embodiment.

As shown in FIG. 7, the array substrate comprises two layers of ITO, i.e., a first ITO pixel electrode layer 7 and a second ITO pixel electrode layer 6.

One of ordinary skill in the art will appreciate that FIGS. 1-3 merely exemplify one position of a via hole on the gate line 2 and/or the data line 9, when the gate line 2 and/or the data line 9 are provided with via holes, but does not define that the via holes can only be set at said positions in the gate lines 2 and/or the data lines 9. In practical application, the position of a via hole in the gate line 2 and/or the data line 9 is determined by the position where the spacer is actually located.

In an exemplary embodiment, the array substrate to which the spacer position corresponds comprises an active layer 5, a passivation layer 4, and an ITO pixel electrode layer.

In an exemplary embodiment, the array substrate to which the spacer position corresponds comprises a first ITO pixel electrode layer 7, an active layer 5, a passivation layer 4, and a second ITO pixel electrode layer 6.

One of ordinary skill in the art will appreciate that the structures comprised by the array substrate to which the spacer position corresponds are merely exemplified herein. It is not intended that the array substrate can only comprise these structures. In practice, the structure of the array substrate to which the spacer position corresponds is determined by the position of the spacer actually set.

In the respective exemplary embodiments, the sizes of the via holes at the positions in the gate line 2, the data line, the gate insulating layer 3, and the passivation layer 4 which correspond to the spacer are not uniquely limited here. The size of the via hole during actual production thereof can be set dependent on the size of the port of the spacer. The shape of the via hole is also not uniquely limited here. It can be a shape which is convenient to manufacture. It should be a shape through which the port of the spacer in the present examples can pass.

In the array substrate provided, according to an exemplary embodiment, by setting a via hole in the gate line 2 and/or the data line on the array substrate at a position corresponding to the spacer, the gate line 2 and/or the data line on the array substrate to which the spacer position corresponds are removed, such that there does not exist the problem that the gate line 2 and/or the data line on the array substrate to which the spacer position corresponds have non-uniform thicknesses, thereby solving the problem in conventional display panels of gaps having different sizes existing after cell assembly of display panels because of non-uniform thicknesses of the gate line and/or the data line on the array substrate to which the spacer corresponds. This, in turn, avoids the problem of inhomogeneous color in the display. Meanwhile, the qualification rate of the obtained displays can be greatly increased, which reduces waste of the production materials, significantly reduces production costs, and improves production efficiency.

Figure 8:
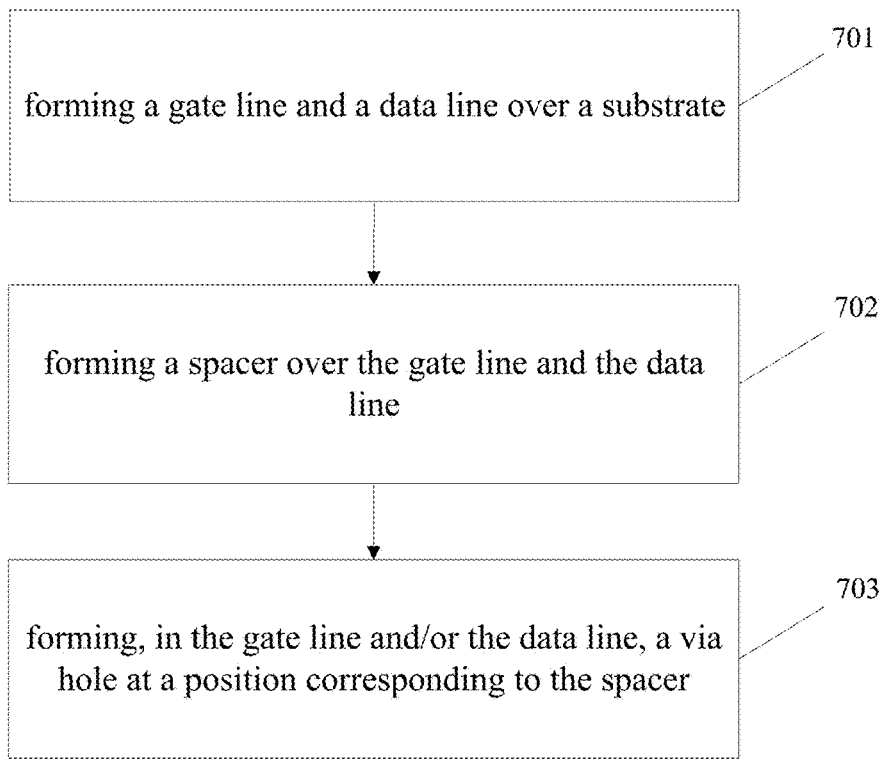
FIG. 8 is a flow diagram of a method of producing another array substrate, according to an exemplary embodiment.

A method of producing an array substrate, according to an exemplary embodiment, is shown in FIG. 8. The method comprises the following steps: Step 701 includes forming a gate line and a data line over a substrate; Step 702 includes forming a spacer over the gate line and the data line; and Step 703 includes forming in the gate line and/or the data line, a via hole at a position corresponding to the spacer.

Forming the gate line over the substrate may comprise forming a gate metal layer over the substrate and patterning the gate metal layer to form a pattern of the gate line. For example, a metal thin film layer having a thickness of from 1,000 Å to 7,000 Å is deposited on a substrate, such as glass or quartz substrate, using a magnetron sputtering method. Said metal thin film can employ any suitable material, such as molybdenum, aluminum, aluminum-nickel alloy, molybdenum-tungsten alloy, chromium, copper, etc., and can also employ a combined structure of the above thin film materials. Thereafter, said metal thin film is treated with a mask plate by means of a patterning process such as exposure, development, etching, and stripping to form the pattern of the gate line in the gate metal layer.

Specifically, forming, in the gate line, a via hole at a position corresponding to the spacer comprises forming a gate insulating layer on the gate line; and forming a via hole penetrating the gate line and the gate insulating layer at a position corresponding to the spacer. For example, a gate insulating layer thin film having a thickness of from 1,000 Å to 6,000 Å is deposited on the substrate using a chemical vapor deposition method or a magnetron sputtering method. Said gate insulating layer thin film can employ any suitable material, such as nitrogen oxide, silicon oxide, silicon oxynitride, etc.

Specifically, forming the data line over the substrate comprises forming a source or a drain metal layer on the gate insulating layer and patterning the source or drain metal layer to forming a pattern of the data line. For example, a metal thin film layer similar to the gate metal having a thickness of from 1,000 Å to 7,000 Å is deposited on the substrate using a method similar to that used to produce the gate metal layer. Said metal thin film layer is treated by a patterning process to form a source electrode, a drain electrode, and a data line over a certain region.

The above method may further comprises forming a passivation layer on the data line; and forming a via hole in the passivation layer at a position corresponding to the spacer.

In the method of producing an array substrate, according to this exemplary embodiment, by forming a via hole in the gate line and/or the data line on the array substrate at a position corresponding to the spacer, the gate line and/or the data line on the array substrate to which the spacer position corresponds are removed. In this manner, there does not exist the problem that gate lines and data lines on the array substrate to which the spacer position corresponds have non-uniform thicknesses, thereby solving the problem in conventional display panels of gaps having different sizes after cell assembly of display panels because of non-uniform thicknesses of gate lines and data lines on the array substrate to which the spacer corresponds. This, in turn, avoids the problem of inhomogeneous color in the display. Meanwhile, the qualification rate of the obtained displays can be greatly improved, which reduces waste of the production materials, significantly reduces production costs, and improves production efficiency.

Figure 9:
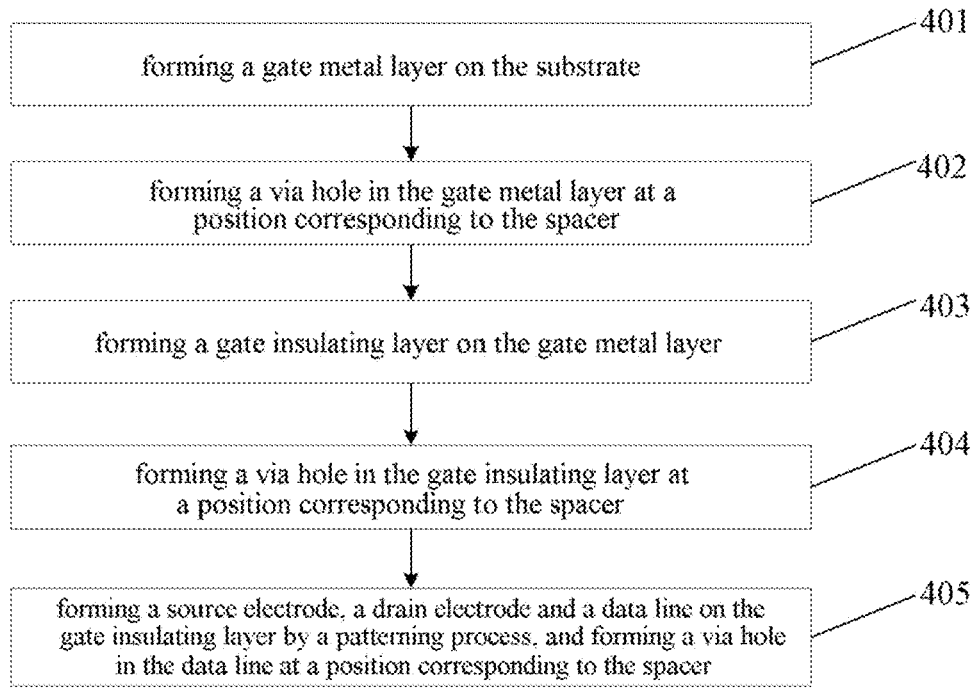
FIG. 9 is a flow diagram of a method of producing yet another array substrate, according to an exemplary embodiment.

A method of producing an array substrate, according to an exemplary embodiment, is shown in FIG. 9. The method comprises the following steps:

Step 401 includes forming a gate metal layer on a substrate. Specifically, a gate metal layer comprising a gate line and a gate is formed on a substrate by a patterning process.

Step 402 includes forming a via hole in the gate metal layer at a position corresponding to the spacer.

Step 403 includes forming a gate insulating layer on the gate metal layer.

Step 404 includes forming a via hole in the gate insulating layer at a position corresponding to the spacer. The via hole in the gate insulating layer is connected to the via hole in the gate metal layer.

The step 403 of forming a gate insulating layer and the step 404 of forming a via hole in the gate insulating layer can be performed in any order.

The via hole in the step 402 can be formed simultaneously with the formation of the gate metal layer in the step 401 using the same process, which can also be formed simultaneously with the formation of the via hole in the gate insulating layer in the step 404. In practice, the specific operation order is determined by the formation of via holes in the gate metal layer and the gate insulating layer.

Step 405 includes forming a source electrode, a drain electrode, and a data line in the gate insulating layer by a patterning process, and forming a via hole in the data line at a position corresponding to the spacer.

Figure 10:
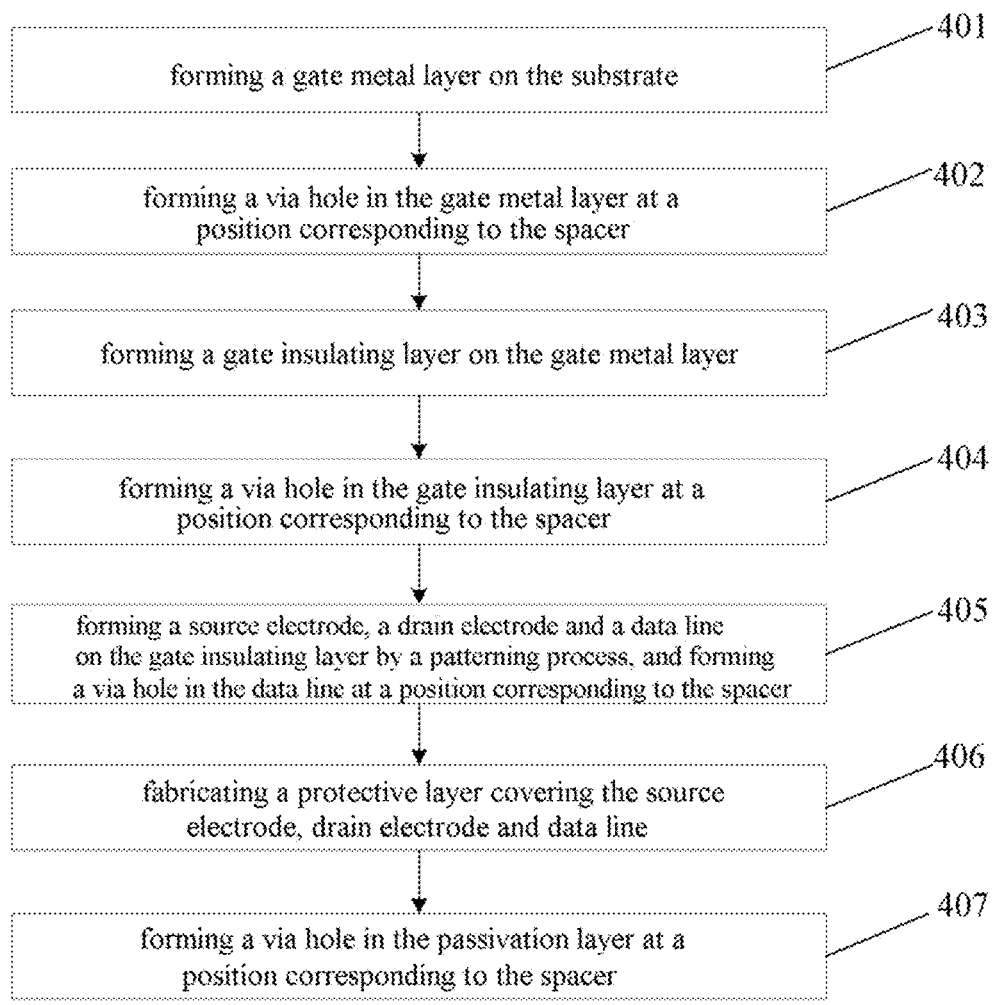
FIG. 10 a flow diagram of a method of producing still another array substrate, according to an exemplary embodiment.

As shown in FIG. 10, a further exemplary embodiment includes the following additional steps, after the step 405:

Step 406 includes fabricating a protective layer covering the source electrode, drain electrode, and data line. Specifically, using a method similar to that used to produce the gate insulating layer and the active layer, the whole substrate is coated with a passivation layer having a thickness of from 1,000 Å to 6,000 Å, and the material thereof can be, for example, silicon nitride or transparent organic resin material.

Step 407 includes forming a via hole in the passivation layer at a position corresponding to the spacer. Specifically, said via hole can be formed by any suitable process, for example, etching.

The same descriptions of the steps of the flow in the present exemplary embodiment are similar to the explanations provided in the above exemplary embodiment, and will not be repeated here.

If the gate insulating layer is formed by a sputtering process using a sputtering device during production, due to the deficiencies possessed by the sputtering device, and if the array substrate where the spacer is located has the gate insulating layer, there will be the problem of inhomogeneous color in the display because gaps of different sizes will exist after cell assembly of display panels due to non-uniform thicknesses of the gate insulating layer. However, in accordance with this exemplary embodiment, the position in the gate insulating layer which corresponds to the spacer is provided with a via hole, which can effectively avoid the problem of inhomogeneous color in the display, greatly reduce production costs, and improve production efficiency.

In the method of producing an array substrate, according to this exemplary embodiment, by forming a via hole in the gate line on the array substrate at a position corresponding to the spacer, the gate line on the array substrate to which the spacer position corresponds is removed. In this manner, there does not exist the problem that gate lines on the array substrate to which the spacer position corresponds have non-uniform thicknesses, thereby solving the problem in conventional display panels of gaps having different sizes after cell assembly of display panels because of non-uniform thicknesses of gate lines on the array substrate to which the spacer corresponds. This, in turn, avoids the problem of inhomogeneous color in the display. Meanwhile, the qualification rate of the obtained displays can be greatly improved, which reduces waste of the production materials, significantly reduces production costs, and improves production efficiency.

Furthermore, forming a via hole in the gate insulating layer at a position corresponding to the spacer avoids the problem that the display panel has a non-uniform thickness because the gate insulating layer was formed using a sputtering device.

Figure 11:
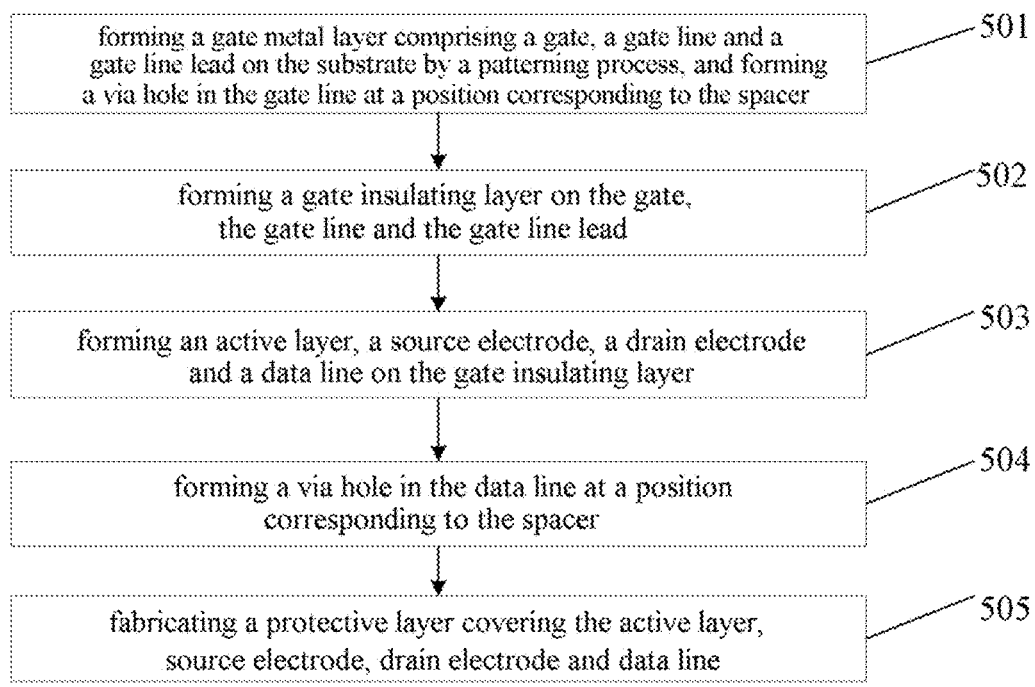
FIG. 11 a flow diagram of a method of producing another array substrate, according to an exemplary embodiment.

A method of producing an array substrate, according to an exemplary embodiment, is shown in FIG. 11. In this case, the gate line and the data line are both provided with a via hole at a position corresponding to the spacer. The method comprises the following steps:

Step 501 includes forming a gate metal layer comprising a gate, a gate line, and a gate line lead on a substrate by a patterning process, and forming a via hole in the gate line at a position corresponding to the spacer. Said via hole may be formed, for example, by an etching process using a mask plate. Specifically, a metal thin film layer having a thickness of from 1,0001 Å to 7,000 Å is deposited on a substrate, such as a glass or quartz substrate, using a magnetron sputtering or a thermal evaporation method. Said metal thin film can employ any suitable material, such as molybdenum, aluminum, aluminum-nickel alloy, molybdenum-tungsten alloy, chromium, copper, etc., and can also employ a combined structure of the above thin film materials. Thereafter, said metal thin film is treated with a mask plate by means of a patterning process such as exposure, development, etching, and stripping to form a plurality of lateral gate lines and gates connected to the gate lines, as well as gate line leads between gate lines over a certain region of the substrate.

Step 502 includes forming a gate insulating layer over the gates, gate lines, and gate line leads. Specifically, a gate electrode insulating layer thin film having a thickness of from 1,0001 Å to 6,000 Å can be deposited on the substrate using a chemical vapor deposition method or a magnetron sputtering method. Said gate insulating layer thin film can employ any suitable material, such as nitrogen oxide, silicon oxide, silicon oxynitride, etc.

Step 503 includes forming a source electrode, a drain electrode, and a data line on the gate insulating layer. Specifically, a metal oxide semiconductor thin film can be deposited on the gate insulating layer using a chemical vapor deposition method, and then the metal oxide semiconductor thin film is treated by a patterning process to form an active layer, i.e., forming an active layer by performing exposure, development, and etching of the substrate using a common mask plate after it is coated with photoresist. Further, a metal thin film layer similar to the gate metal having a thickness of from 1,000 Å to 7,000 Å is deposited on the substrate using a method similar to that used to produce the gate lines. Said metal thin film layer is treated by a patterning process to form a source electrode, a drain electrode, and a data line over a certain region.

Step 504 includes forming a via hole in the data line at a position corresponding to the spacer. Said via hole can be formed, for example, by an etching process using a mask plate.

In an exemplary embodiment, the step 505 of forming the via hole in the data line and the step 504 of forming the data line are performed simultaneously.

Step 505 includes forming a protective layer covering the active layer, the source electrode, the drain electrode, and the data line. Specifically, using a method similar to that used to produce the gate insulating layer and the active layer, the whole substrate is coated with a passivation layer having a thickness of from 1,000 Å to 6,000 Å, and the material thereof is, for example, silicon nitride or transparent organic resin material.

In the method of producing an array substrate, according to this exemplary embodiment, by forming a via hole in the gate line and the data line on the array substrate at a position corresponding to the spacer, the gate line and the data line on the array substrate to which the spacer position corresponds are removed. In this manner, there does not exist the problem that the gate lines and the data lines on the array substrate to which the spacer position corresponds have non-uniform thicknesses, thereby solving the problem in conventional display panels of gaps having different sizes after cell assembly of display panels because of non-uniform thicknesses of gate lines and data lines on the array substrate to which the spacer corresponds. This, in turn, avoids the problem of inhomogeneous color in the display. Meanwhile, the qualification rate of the obtained displays can be greatly improved, which reduces waste of the production materials, significantly reduces production costs, and improves production efficiency.

A display panel, according to an exemplary embodiment, comprises any of the exemplary array substrates disclosed or suggested herein and an opposite substrate. The spacer is arranged between the array substrate and the opposite substrate to define a gap between the array substrate and the opposite substrate. Said display panel may be a display panel of any product or component having a display function, such as a mobile phone, a tablet computer, a television, a notebook computer, a digital frame, a GPS navigator, etc.

In the display panel, according to this exemplary embodiment, by forming a via hole in the gate line and/or the data line on the array substrate at a position corresponding to the spacer, the gate line and/or the data line on the array substrate to which the spacer position corresponds is removed. In this manner, there does not exist the problem that gate lines and/or data lines on the array substrate to which the spacer position corresponds have non-uniform thicknesses, thereby solving the problem in conventional display panels of gaps having different sizes after cell assembly of display panels because of non-uniform thicknesses of gate lines and/or data lines on the array substrate to which the spacer corresponds. This, in turn, avoids the problem of inhomogeneous color in the display. Meanwhile, the qualification rate of the obtained displays can be greatly improved, which reduces waste of the production materials, significantly reduces production costs, and improves production efficiency.

Although the present disclosure has been described with reference to specific embodiments, it should be understood that the limitations of the described embodiments are provided merely for purpose of illustration and are not intended to limit the present invention and associated general inventive concepts. Instead, the scope of the present invention is defined by the appended claims, and all variations and equivalents that fall within the range of the claims are intended to be embraced therein. Thus, other embodiments than the specific exemplary ones described herein are equally possible within the scope of these appended claims.

The invention claimed is:

1. An array substrate comprising:
   a substrate;
   a gate line and a data line arranged over the substrate;
   a spacer arranged over the gate line and the data line; and
   a via hole physically penetrating through at least one of the gate line and the data line, wherein an orthographic projection of the via hole on the substrate at least partially overlaps with an orthographic projection of the spacer on the substrate.

2. The array substrate according to claim 1, further comprising:
   a gate insulating layer between the gate line and the spacer;
   wherein the gate insulating layer is provided with a second via hole, wherein an orthographic projection of the second via hole on the substrate at least partially overlaps with an orthographic projection of the spacer on the substrate.

3. The array substrate according claim 1, further comprising:
   a passivation layer between the data line and the spacer; and
   a further via hole arranged in the passivation layer, wherein an orthographic projection of the further via hole on the substrate at least partially overlaps with the orthographic projection of the spacer on the substrate.

4. The array substrate according to claim 1, further comprising:
   a gate insulating layer;
   an active layer;
   a passivation layer; and
   an ITO pixel electrode layer;
   wherein each of the gate insulating layer, the active layer, the passivation layer; and the ITO pixel electrode layer are disposed between the gate line and the spacer.

5. The array substrate according to claim 1, further comprising:
   a passivation layer; and
   an ITO pixel electrode layer;
   wherein each of the passivation layer and the ITO pixel electrode layer are disposed between the date line and the spacer.

6. The array substrate according to claim 1, further comprising:
   a first ITO pixel electrode layer;
   a gate insulating layer;
   an active layer;
   a passivation layer; and
   a second ITO pixel electrode layer;
   wherein each of the first ITO pixel electrode layer, the gate insulating layer, the active layer, the passivation layer; and the second ITO pixel electrode layer are disposed between the gate line and the spacer.

7. A method for producing an array substrate, comprising:
forming a gate line and a data line over a substrate;
forming a spacer over the gate line and the data line; and
forming a via hole physically penetrating through at least one of the rate line and the data line, wherein an orthographic projection of the via hole on the substrate at least partially overlaps with an orthographic projection of the spacer on the substrate.

8. The method according to claim 7, wherein forming the gate line over the substrate comprises:
forming a gate metal layer over the substrate; and
patterning the gate metal layer to form a pattern of the gate line.

9. The method according to claim 7, wherein forming, in the gate line, a via hole comprises:
forming a gate insulating layer on the gate line; and
forming a via hole penetrating the gate line and the gate insulating layer, wherein an orthographic projection of the via hole on the substrate at least partially overlaps with an orthographic projection of the spacer on the substrate.

10. The method according to claim 9, wherein forming the data line over the substrate comprises:
forming a source/drain metal layer on the gate insulating layer; and
patterning the source/drain metal layer to form a pattern of the data line.

11. The method according to claim 7, further comprising:
forming a passivation layer on the data line; and
forming a further via hole in the passivation layer, wherein an orthographic projection of the further via hole on the substrate at least partially overlaps with an orthographic projection of the spacer on the substrate.

12. A display panel, comprising:
an array substrate comprising:
a substrate;
a gate line and a data line arranged over the substrate; and
a spacer arranged over the gate line and the data line;
a via hole physically penetrating through at least one of the gate line and the data line, wherein an orthographic projection of the via hole on the substrate at least partially overlaps with an orthographic projection of the spacer on the substrate; and
an opposite substrate;
wherein the spacer is arranged between the array substrate and the opposite substrate so as to define the gap between the array substrate and the opposite substrate.

13. The display panel according to claim 12, wherein the array substrate further comprises:
a gate insulating layer between the gate line and the spacer;
wherein the gate insulating layer is provided with a second via hole, wherein an orthographic projection of the second via hole on the substrate at least partially overlaps with an orthographic projection of the spacer on the substrate.

14. The display panel according to claim 12, wherein the array substrate further comprises:
a passivation layer between the data line and the spacer;
wherein the passivation layer is provided with a further via hole, wherein an orthographic projection of the further via hole on the substrate at least overlaps with an orthographic projection of the spacer on the substrate.

15. The display panel according to claim 12, wherein the array substrate further comprises:
a gate insulating layer;
an active layer;
a passivation layer; and
an ITO pixel electrode layer;
wherein each of the gate insulating layer, the active layer, the passivation layer; and the ITO pixel electrode layer are disposed between the gate line and the spacer.

16. The display panel according to claim 12, wherein the array substrate further comprises:
a passivation layer; and
an ITO pixel electrode layer;
wherein each of the passivation layer and the ITO pixel electrode layer are disposed between the date line and the spacer.

17. The display panel according to claim 12, wherein the array substrate further comprises:
a first ITO pixel electrode layer;
a gate insulating layer;
an active layer;
a passivation layer; and
a second ITO pixel electrode layer;
wherein each of the first ITO pixel electrode layer, the gate insulating layer, the active layer, the passivation layer; and the second ITO pixel electrode layer are disposed between the gate line and the spacer.

* * * * *